(12) United States Patent
Iwata et al.

(10) Patent No.: US 8,278,822 B2
(45) Date of Patent: Oct. 2, 2012

(54) LIGHT-EMITTING ELEMENT

(75) Inventors: Masatoshi Iwata, Tokyo (JP); Norio Tasaki, Tokyo (JP); Yoshiyuki Kobayashi, Tokyo (JP); Tetsuya Matsuura, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/054,261

(22) PCT Filed: Jun. 5, 2009

(86) PCT No.: PCT/JP2009/060360
§ 371 (c)(1),
(2), (4) Date: Jan. 14, 2011

(87) PCT Pub. No.: WO2010/007841
PCT Pub. Date: Jan. 21, 2010

(65) Prior Publication Data
US 2011/0115359 A1    May 19, 2011

(30) Foreign Application Priority Data
Jul. 17, 2008    (JP) .................. 2008-186400

(51) Int. Cl.
*H05B 33/00*    (2006.01)
(52) U.S. Cl. .................. 313/506; 313/112; 313/113
(58) Field of Classification Search ........................ None
See application file for complete search history.

(56) References Cited

U.S. PATENT DOCUMENTS

2007/0241668 A1 * 10/2007 Ottermann et al. ........... 313/504
2008/0043796 A1 *  2/2008 Jikutani et al. ............. 372/50.11

FOREIGN PATENT DOCUMENTS

| JP | A 9-074218 | 3/1997 |
| JP | A 9-172197 | 6/1997 |
| JP | A 9-289336 | 11/1997 |
| JP | A 2001-339098 | 12/2001 |
| JP | A 2004-241462 | 8/2004 |
| JP | A 2004-304049 | 10/2004 |
| JP | A 2005-005558 | 1/2005 |
| JP | A 2005-116922 | 4/2005 |

OTHER PUBLICATIONS

International Search Report issued in PCT/JP2009/060360, mailed Jul. 7, 2009. (with English-language translation).
Jun. 14, 2012 Office Action cited in Chinese Patent Application No. 200980136552.2 (with translation).

* cited by examiner

*Primary Examiner* — Ashok Patel
(74) *Attorney, Agent, or Firm* — Oliff & Berridge, PLC

(57) ABSTRACT

A light-emitting element comprising a substrate; a light-emitting layer disposed above the substrate and emitting a primary light; and, a reflective film disposed between the substrate and the light-emitting layer and formed by at least one layer that reflects the primary light, in which the light-emitting element further comprises a light dispersing multilayered film disposed between the substrate and the reflective film and formed by two or more types of light dispersing layers, and the light dispersing multilayered film multiple-disperses a secondary light into plural wavelengths and discharges the secondary light, which is excited by the primary light passing through the reflective film.

13 Claims, 13 Drawing Sheets

FIG. 8
(a)
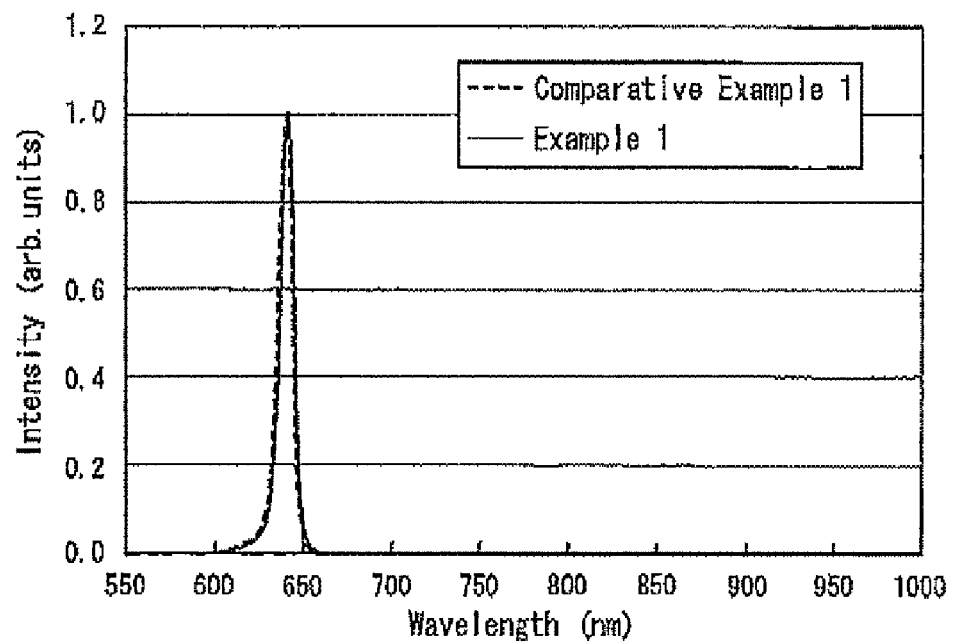
(b)
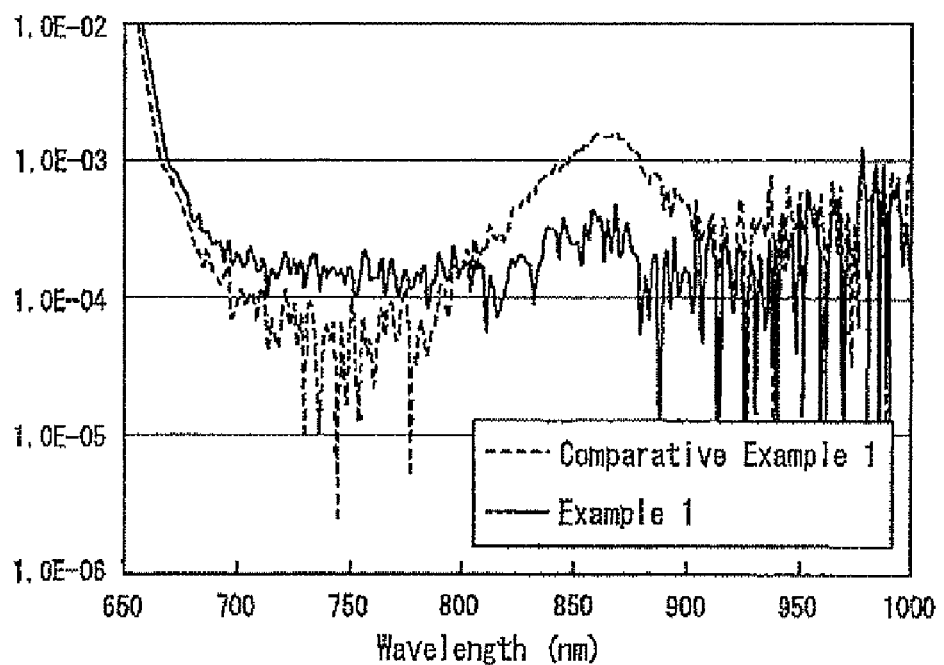

FIG. 9
(a)
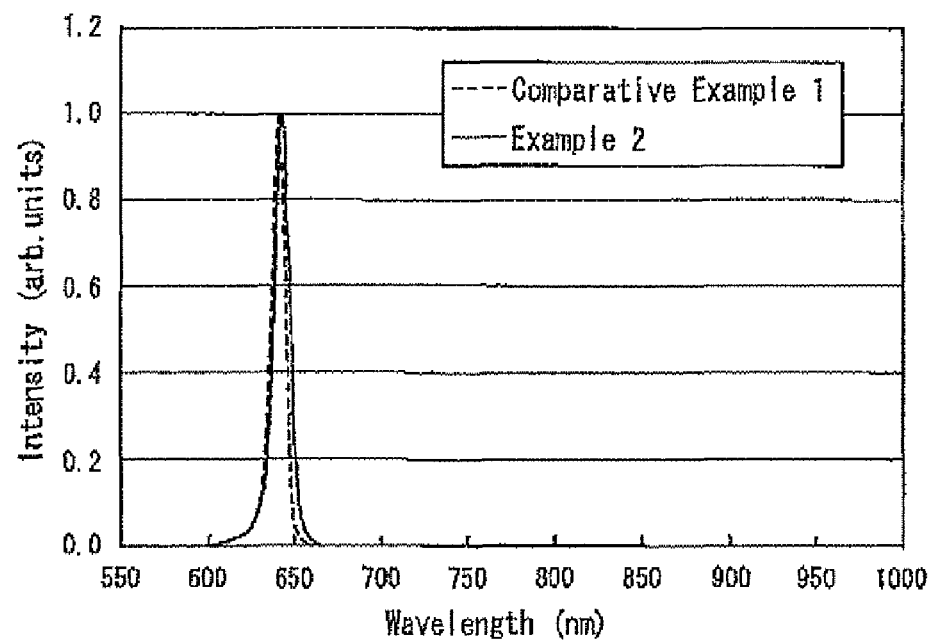
(b)
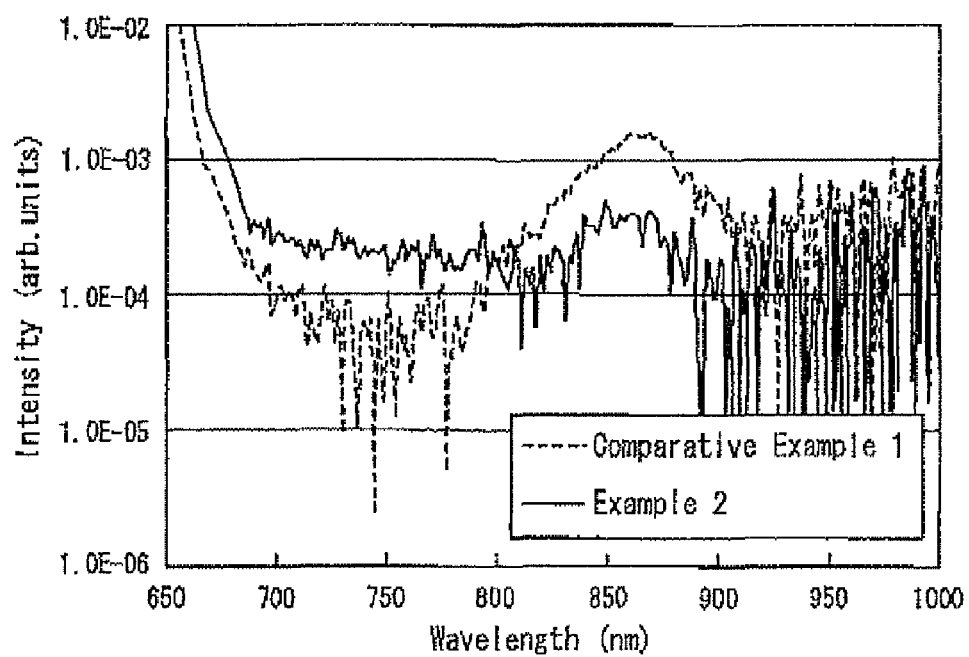

LIGHT-EMITTING ELEMENT

TECHNICAL FIELD

The present invention relates to a light-emitting element that emits a primary light at a light-emitting layer, and, in particular, to a light-emitting element used, for example, for sensors and the like.

BACKGROUND ART

In general, in a light-emitting element having a double hetero structure, a primary light emitted at a light-emitting layer directs not only toward a front surface of the light-emitting element but also isotropically toward all directions. The primary light directing toward a rear surface of the light-emitting element is absorbed or scattered by a rear-surface electrode or a substrate, and hence does not contribute directly to a light output, which causes the reduction of a light-emitting efficiency.

In order to suppress such a phenomenon as this, there has been developed a technique in which a reflective film formed by at least one layer and reflecting the primary light is arranged between the substrate and the light-emitting layer. However, with this technique, it is difficult to completely reflect the primary light, that is, part of the primary light passes through the reflective film and reaches the substrate, and an excited light is secondarily emitted from the substrate. This excited light from the substrate has a wavelength different from the primary light, and hence, causes a problem that the excited light serves as a noise when used in a sensor for example, possibly having a deleterious effect on reliability of operation of the sensor. Further, in a case of suppressing the excited light from the substrate by absorbing the light, the excited light is accumulated as heat within the light-emitting element, which also has a deleterious effect on the reliability of operation of the sensor.

In view of the facts described above, Patent Literature 1 discloses a technique in which, in a red light emitting diode, a transparent layer having a higher Al composition than that of an active layer is formed between a substrate and the active layer to control an intensity of an excited light generated at the substrate.

Further, Patent Literature 2 discloses a technique in which a reflective layer is disposed between a light-emitting layer and a semiconductor having a composition different from the light-emitting layer, to suppress an excited light generated at the semiconductor from being picked up from a surface.

The purposes of these disclosed techniques are to control or suppress the intensity of the generated exited light, but a peak intensity of the excited light generated at the substrate cannot be sufficiently suppressed. Further, in the case of this method of controlling the excited light, light energy is absorbed, so that heat is accumulated.

RELATED ART DOCUMENT

Patent Literature

Patent Literature 1: Japanese Patent Application Laid-open No. 2005-116922
Patent Literature 2: Japanese Patent Application Laid-open No. 9-289336

SUMMARY OF THE INVENTION

Problems to be Solved by the Invention

An object of the present invention is to provide a light-emitting element in which a peak intensity of an excited light generated at a substrate by a primary light is reduced, thereby reducing a deleterious effect of the excited light on reliability of operation of a sensor. Another object of the present invention is to provide a light-emitting element possessing improved reliability, in which the peak intensity is reduced without absorbing the excited light, whereby heat is not generated within the light-emitting element.

Means for Solving the Problem

To achieve the objects above, main configurations of the present invention are as follows:

(1) A light-emitting element including a substrate; a light-emitting layer disposed above the substrate and emitting a primary light; and, a reflective film disposed between the substrate and the light-emitting layer and formed by at least one layer that reflects the primary light, in which the light-emitting element further includes a light dispersing multilayered film disposed between the substrate and the reflective film and formed by two or more types of light dispersing layers, and the light dispersing multilayered film multiple-disperses a secondary light into plural wavelengths and discharges the secondary light, which is excited by the primary light passing through the reflective film.

(2) The light-emitting element according to (1) described above, in which the light dispersing multilayered film is made of an $Al_xGa_{(1-x)}As$ material ($0 \leq x \leq 1$), an Al composition (x) in the $Al_xGa_{(1-x)}As$ material is made continuously changed between a lower Al composition and a higher Al composition in a thickness direction of the light dispersing multilayered film from the substrate side toward the reflective film side, while the change is being made plural times, and the Al composition (x) of at least one of the lower Al composition and the higher Al composition to be changed and a thickness of each of the light dispersing layers are changed in a stepwise manner.

(3) The light-emitting element according to (2) described above, in which a difference between the lower Al composition and the higher Al composition(x) is sequentially decreased for every plural cycles from the substrate side toward the reflective film side, and the thickness of each of the light dispersing layers is sequentially increased for every plural cycles from the substrate side toward the reflective film side.

(4) The light-emitting element according to (1), (2) or (3) described above, in which the light dispersing multilayered film reflects a substrate excited light excited by the primary light passing through the light dispersing multilayered film and reaching the substrate.

(5) The light-emitting element according to any one of (1)-(4) described above, in which the thickness of the light dispersing multilayered film is 500-1500 nm.

Effect of the Invention

A light-emitting element according to the present invention includes a light dispersing multilayered film disposed between a substrate and a reflective film and formed by two or more types of light dispersing layers, and the light dispersing multilayered film multiple-disperses a secondary light excited by a primary light passing through the reflective film into plural wavelengths, and discharges the secondary light. More specifically, energy of the primary light passing through the reflective film is divided into plural wavelengths, so that excitement and discharge are performed little by little; this reduces the light energy arriving at the substrate, thereby suppressing excitation of the substrate; and, a peak intensity of the light is reduced, whereby the deleterious effect on the reliability of operation of a sensor is reduced. Further, the peak intensity is reduced without absorbing the excited light, thereby preventing heat from being generated within the light-emitting element. Accordingly, it is possible to provide a light-emitting element possessing the improved reliability.

BRIEF DESCRIPTION OF THE DRAWINGS

FIGS. 8(a) and 8(b) are graphs illustrating measurement results of an emission spectrum on light-emitting elements according to Example 1 and Comparative Example 1, respectively;

FIGS. 9(a) and 9(b) are graphs illustrating measurement results of an emission spectrum on light-emitting elements according to Example 2 and Comparative Example 1, respectively;

MODE FOR CARRYING OUT THE INVENTION

Figure 1:
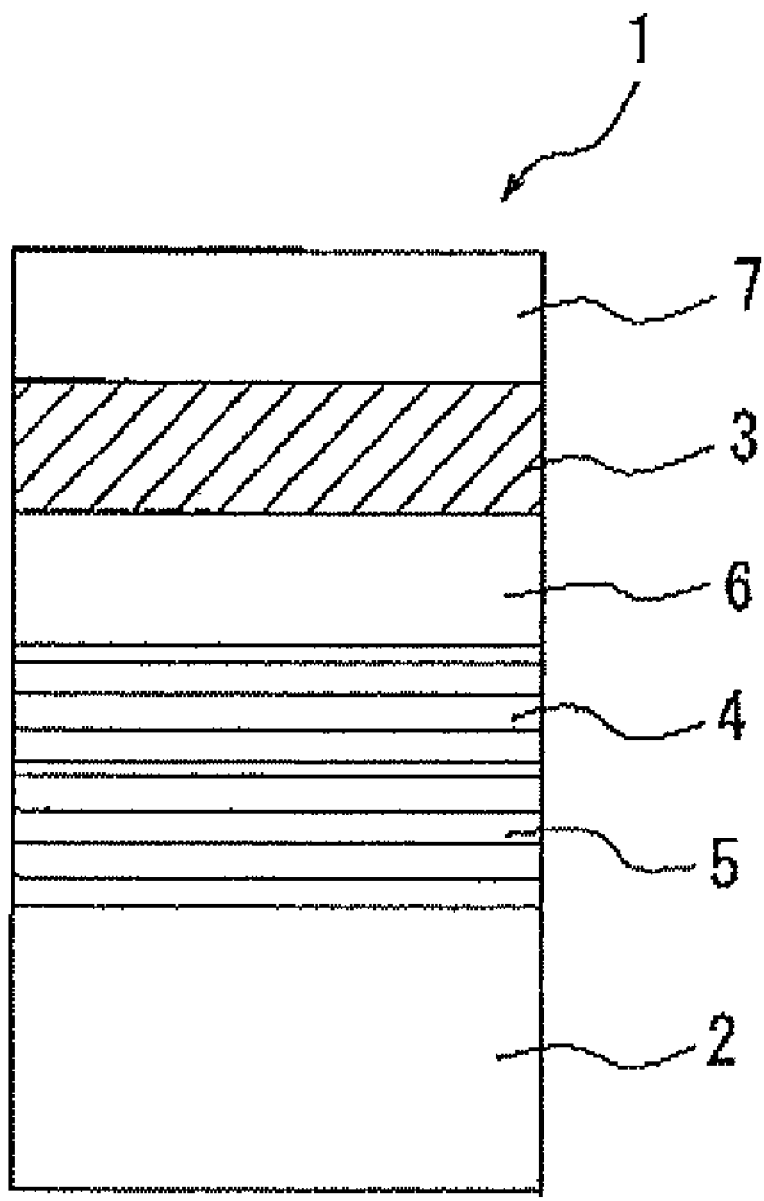
FIG. 1 is a schematic diagram illustrating a light-emitting element according to the present invention.

Next, an embodiment of a light-emitting element according to the present invention will be described with reference to the drawings. FIG. 1 schematically illustrates a sectional structure of the light-emitting element according to the present invention. In FIG. 1, hatchings are applied for the sake of explanation.

A light-emitting element 1 illustrated in FIG. 1 is provided with: a substrate 2; an light-emitting layer 3 disposed above the substrate 2 and emitting a primary light; a reflective film 4 disposed between the substrate 2 and the light-emitting layer 3 and formed by at least one layer that reflects the primary light; and, a light dispersing multilayered film 5 disposed between the substrate 2 and the reflective film 4 and formed by two or more types of light dispersing layers. With this configuration, it is possible to multiple-disperse a secondary light excited by the primary light that is not completely reflected by the reflective film 4 and passes through the reflective film 4 into plural wavelengths with the light dispersing multilayered film 5, and discharge it.

In the light-emitting element 1, at least the light dispersing multilayered film 5, the reflective film 4 and the light-emitting layer 3 are formed on the substrate 2 by an epitaxial growth by using an MOCVD method. FIG. 1 illustrates the light-emitting element 1 having a double hetero structure in which $In_yGa_{(1-y)}P$ quantum well light-emitting layer 3 formed above the GaAs substrate 2 is sandwiched between AlGaInP clad layers 6, 7. As a film formation method by the MOCVD method, it is possible to employ any known method of forming films of compound semiconductor. As the substrate 2, it is possible to employ a GaAs substrate 2 having a plane direction whose off angle with respect to (100) is 2° or more.

Although not illustrated in FIG. 1, a current narrowing layer may be formed in the vicinity of the light-emitting layer 3. In this case, the current narrowing layer may have any size of an electrode area, and may have a mesa shape or a protection film depending on applications. Further, the current narrowing layer may be grown so as to be a first conductive type layer or a layer not having been doped. Yet further, the current narrowing layer may be obtained by having a high resistivity by an ion implanting method, by having a desired structure by Zn diffusion, or by forming an oxide layer, oxide film or nitride film.

It is preferable for the light dispersing multilayered film 5 to be made of an $Al_xGa_{(1-x)}As$ material ($0 \leq x \leq 1$). This is because, by using the AlGaAs-based material, an Al composition and a Ga composition are easily controlled; a degree of lattice mismatch with the GaAs substrate 2 is small; and, an index of reflection and a band gap can be extensively selected. Further, since the index of reflection decreases as the Al composition increases, an optical design can be easily made, reproducibility is favorable, and a desired structure can be obtained as designed.

Figure 2:
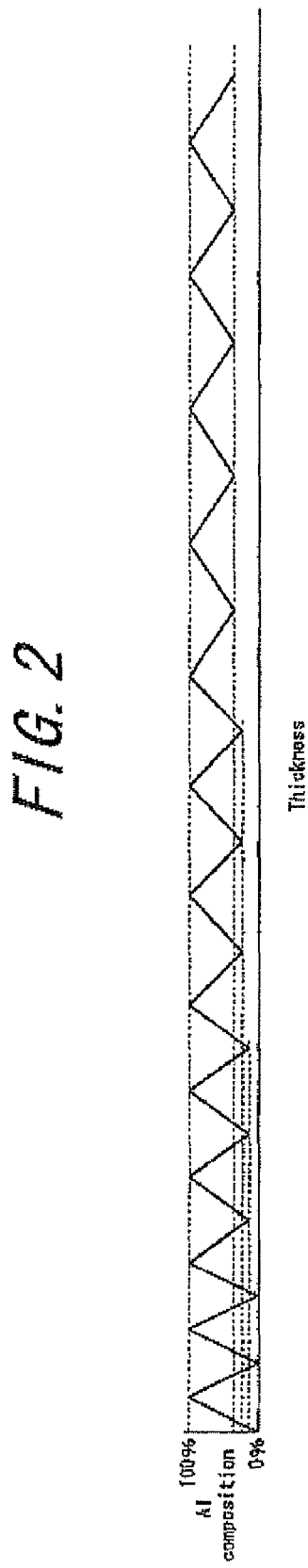
FIG. 2 is a graph illustrating one example of a pattern of an Al composition in a light dispersing multilayered film made of an $Al_xGa_{(1-x)}As$ material.

As illustrated in FIG. 2 as one example, it is preferable that the Al composition (x) in the $Al_xGa_{(1-x)}As$ material is made continuously changed between a lower Al composition (referred to as "L-side") and a higher Al composition (referred to as "H-side") in a thickness direction of the light dispersing multilayered film 5 from the substrate 2 side toward the reflective film 4 side, while the change is being made plural times, and at the same time, the Al composition of at least one of the lower Al composition (L-side) and the higher Al composition (H-side) to be changed and a thickness of each of the light dispersing layers are changed in a stepwise manner. Note that the thickness of the light dispersing layer means, for example, a width of one cycle of high Al composition (H-side)-lower Al composition (L-side)-high Al composition (H-side) in FIG. 2. In FIG. 2, a vertical axis represents a ratio of the Al composition (x) in the $Al_xGa_{(1-x)}As$ material (x=1 means 100%, and x=0 means 0%), and a horizontal axis represents a thickness of the light dispersing multilayered film 5 from the substrate 2 side.

With the increase in the Al composition (x), the AlGaAs-based material is brought closer to a range of an indirect transition, which makes it possible to decrease a light-emitting efficiency. On the other hand, since the secondary light is generated in the lower Al composition portion (L-side), it is particularly important to design the lower Al composition that determines a wavelength of the secondary light. Further, it is important for the higher Al composition (H-side) to be designed such that carriers are sufficiently confined in the lower Al composition (L-side) region to efficiently generate the secondary light. As a result, it is preferable for the design of the higher Al composition (H-side) to be fixed, for example, in the region of x=0.9–1.0.

At this time, when the lower Al composition (L-side) and the higher Al composition (H-side) are repeated as similar to a quantum well for example, a confining strength of the quantum well increases, and hence, the light-emitting efficiency is high. This results in generation of the strong secondary emitted light even if the number of layers is low. Therefore, as a confining structure of the lower Al composition (L-side), it is preferable to employ a structure whose light-emitting efficiency is slightly decreased. For example, by using the confining structure in which the composition is made continuously changed between the lower Al composition (L-side) and the higher Al composition (H-side), the light-emitting efficiency sufficient for generating the secondary emitted light can be obtained, although the light-emitting efficiency decreases as compared with the case of the quantum well.

Further, as illustrated in FIG. 2, it is preferable that a difference of the Al composition (x) between the lower Al composition (L-side) and the higher Al composition (H-side) is sequentially decreased for every plural cycles from the substrate 2 side toward the reflective film 4 side, and the thickness of each of the light dispersing layers is sequentially increased for every plural cycles from the substrate 2 side toward the reflective film 4 side. This is because, although the light-emitting efficiency is low in the higher Al composition of the lower Al composition (L-side) as being closer to the range of the indirect transition, the absorption, excitement, and generation of the secondary light can be efficiently performed by bring the higher Al composition layer of the lower Al composition (L-side) closer to the light-emitting layer, and the intensity of the secondary light can be adjusted by varying the number of layers as needed. Further, with distance from the light-emitting layer, the intensity of the transmitting light decreases, that is, the intensity of the excitement of the secondary light decreases. However, by decreasing the Al composition of the lower Al composition (L-side) at a portion where the secondary light is generated, the lower Al composition thereof becomes closer to a direct transition and the light-emitting efficiency increases; and, by varying the number of layers, the intensity of the secondary light can be adjusted. Therefore, by sequentially increasing a wavelength with respect to an emitted wavelength at an active layer, it is possible to set plural ranges of secondary excitement, and to discharge the light in a state of light energy while suppressing the heat generation caused by the secondary excitement. This makes it possible to divide and diverge the secondary excited light into plural wavelengths at a weak intensity that does not pose any problem.

It should be noted that a method for narrowing the difference between the Al compositions (x) includes the following three cases: sequentially decreasing only the higher Al composition (H-side); sequentially decreasing the higher Al composition (H-side) while sequentially increasing the lower Al composition (L-side); and, sequentially increasing only the lower Al composition (L-side). In the case of sequentially decreasing only the higher Al composition (H-side), the lower Al composition (L-side) that causes the secondary emitted light is determined uniquely, and hence, the secondary emitted light cannot be weak sufficiently. Further, in the case of sequentially decreasing the higher Al composition (H-side) while sequentially increasing the lower Al composition (L-side), it is difficult to effectively generate the secondary emitted light because the confining effect is weak when the higher Al composition decreases at the same time when the light-emitting efficiency decreases by increasing the lower Al composition (L-side). Accordingly, it is preferable to sequentially increase only the lower Al composition (L-side).

It is preferable for the light dispersing multilayered film 5 to reflect a substrate excited light that is excited by the primary light passing through the light dispersing multilayered film 5 and reaching the substrate 2. By averaging indices of refraction (=(index of refraction on the lower Al side+index of refraction on the higher Al side)/2), and implementing optical design using a thickness of the film (using the Bragg's reflection equation $d=\lambda/4n$), it is possible to make the light dispersing multilayered film 5 function as a reflective layer that reflects the substrate excited light. In a case of using the GaAs substrate for example, in order to function as a reflective layer that reflects a wavelength of 870 nm of the substrate excited light, when one cycle of the Al composition of AlGaAs is set at $x=1 \rightarrow 0 \rightarrow 1$ as one example, a reflection effect for 870 nm can be expected by setting a thickness of one cycle at 65.9 nm. This is based on the fact that the index of refraction of GaAs is 3.6; the index of refraction of AlAs is 3.0; the average index of refraction is 3.3; and, d=870/(4*3.3)= 65.9 nm. This makes it possible to further reduce noises with respect to a signal light.

The thickness of the light dispersing multilayered film 5 can be set at 500-1500 nm. This thickness has a relationship with the number of layers of the light dispersing layer, and it is preferable that the number of layers be set such that the layer of the higher Al composition-lower Al composition-higher Al composition is repeated at 2-5 cycles. When the repeated number is set at one cycle, the intensity of the excitement of the secondary light decreases especially in a composition in the lower Al composition where the Al composition is high and the light-emitting efficiency is low, whereby it is impossible to obtain the intensity of the secondary emitted light sufficient for dispersing. On the other hand, when the repeated number is 6 cycles or more, the intensity of the secondary emitted light becomes too large at a wavelength corresponding to the layered lower Al compositions.

Note that FIGS. 1 and 2 each illustrate a typical example of the embodiment, and the present invention is not limited to this embodiment.

EXAMPLES

Example 1

By using the MOCVD method, a light-emitting element (total thickness (excluding a substrate): 3.9 μm) according to the present invention was formed by sequentially growing: a light dispersing multilayered film (831.5 nm, dopant Se); an n-reflective film (thickness: 1.8 μm, layer formed by repeating $Al_{0.45}Ga_{0.55}As$ (42.3 nm)/AlAs (47.3 nm) 20 times, dopant Se); an n-clad layer (thickness: 90 nm, $Al_{0.5}In_{0.5}P$, dopant Se); a light-emitting layer (thickness: 84 nm, $In_yGa_{(1-y)}P$ (y=0.53), undoped); a p-clad layer (thickness: 180 nm, $Al_{0.5}In_{0.5}P$, dopant Mg); and, a p-reflective layer (thickness: 0.9 μm, layer formed by repeating $Al_{0.45}Ga_{0.55}As$ (42.3 nm)/AlAs (47.3 nm) 10 times, dopant C) on the GaAs substrate (Si doped, plane direction: (100) 15° off, thickness: 350 μm). The p-reflective layer functioned as a vertical resonator with an n-reflective layer, and was inserted to narrow the emission spectrum and make the light-emitting element further suitable for use in sensors.

Figure 3:
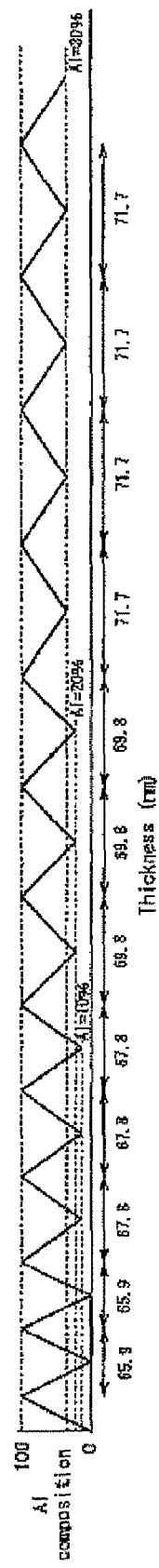
FIG. 3 is a graph illustrating one example of a pattern of the Al composition in a light dispersing multilayered film made of an $Al_xGa_{(1-x)}As$ material according to Example 1.

The light dispersing multilayered film was made of an $Al_xGa_{(1-x)}As$ material ($0 \leq x \leq 1$), and, as illustrated in FIG. 3, was formed such that: the Al composition in the $Al_xGa_{(1-x)}As$ material continuously changed between a lower Al composition and a higher Al composition in a thickness direction of the light dispersing multilayered film from the substrate side toward the reflective film side, while the change was being made plural times; the Al composition of at least one of the lower Al composition and the higher Al composition to be changed and a thickness of each light dispersing layer were changed in a stepwise manner; the difference between the lower Al composition and the higher Al composition was sequentially made smaller from the substrate side toward the reflective film side as illustrated in FIG. 3; and, the thickness of each of the light dispersing layers was sequentially made larger from the substrate side toward the reflective film side as illustrated in FIG. 3. The composition pattern described above can be formed by continuously changing a flow setting of a mass flow meter that controls the amount of gas flow of a raw material in the MOCVD device. Further, the light dispersing multilayered film was formed so as to reflect a wavelength range exhibiting a strong light intensity of a substrate excited light excited by the primary light passing through the light dispersing multilayered film and reaching the substrate. Note that, in FIG. 3, a vertical axis represents a ratio of the Al composition in the $Al_xGa_{(1-x)}As$ material (x=1 means 100%, and x=0 means 0%), and a horizontal axis represents a thickness of the light dispersing multilayered film 5 from the substrate 2 side.

In FIG. 3, the Al composition was designed such that the lower Al composition is formed by 0%×2, 10%×3, 20%×3, and 30%×4 cycles, and the thicknesses of the respective sets of cycles are set at 65.9 nm, 67.8 nm, 69.8 nm, and 71.7 nm so as to reflect the wavelength of 870 nm of the substrate excited light. Note that, since the cycle of the lower Al composition 0% to the higher Al composition 100% (32.9 nm) on the left end and the cycle of the higher Al composition 100% to the lower Al composition 30% (35.9 nm) on the right end do not have the confining effect, these cycles are not included in the number of pairs.

After the respective layers were epitaxially grown, an N electrode (AuGeNi alloy, thickness: 0.2 μm) was formed on the rear surface of the substrate, and, a P round electrode of φ130 μm (AuZn alloy+Ti/Au alloy, thickness: 0.8 μm+1 μm) was formed on the epitaxially grown front surface. Then, a chip was diced to be a square size of 300 μm, and an LED chip was formed. The emission spectrum of this LED chip was evaluated with a method described later. In addition, a PL measurement was made on a sample having only the light dispersing multilayered film grown on the substrate.

Example 2

Figure 4:
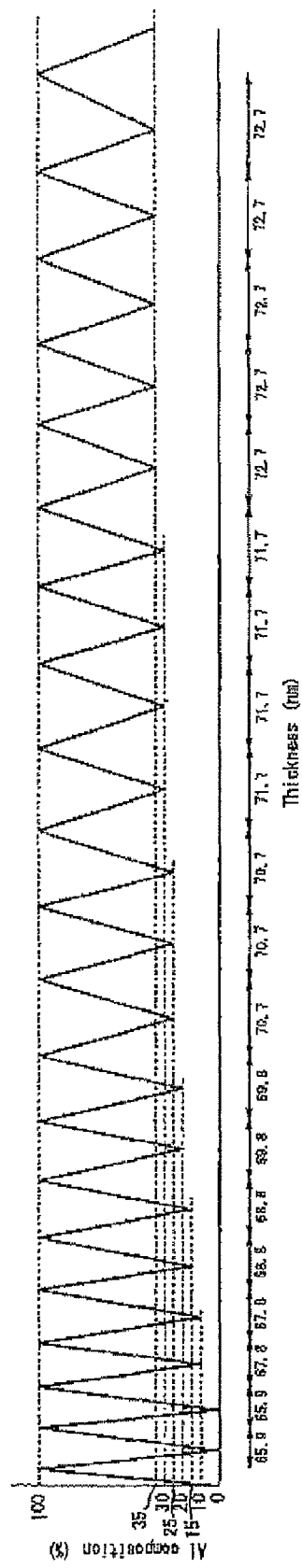
FIG. 4 is a graph illustrating one example of a pattern of the Al composition in a light dispersing multilayered film made of an $Al_xGa_{(1-x)}As$ material according to Example 2.

A light-emitting element similar to that in Example 1 was prepared, except that the light dispersing multilayered film in Example 2 was made of a $Al_xGa_{(1-x)}As$ material (0≦x≦1), and, as illustrated in FIG. 4, the Al composition in the $Al_xGa_{(1-x)}As$ material was designed such that the lower Al composition was formed by 0%×2, 10%×, 15%×2, 20%×2, 25%×3, 30%×4, and 35%×5 cycles, and the thicknesses of the respective sets of cycles were set at 65.9 nm, 67.8 nm, 68.8 nm, 69.8 nm, 70.7 nm, 71.7 nm, and 72.7 nm so as to reflect the wavelength of 870 nm of the substrate excited light. Note that, since the cycle of the lower Al composition 0% to the higher Al composition 100% (32.9 nm) on the left end and the cycle of the higher Al composition 100% to the lower Al composition 35% (36.4 nm) on the right end do not have the confining effect, these cycles are not included in the number of pairs.

In addition, a PL measurement was made on a sample having only the light dispersing multilayered film grown on the substrate.

Comparative Example 1

A light-emitting element (total thickness (excluding a substrate): 4.5 μm) similar to that in Example 1 was prepared, except that the light dispersing multilayered film was not formed in Comparative Example 1.

Comparative Example 2

Figure 5:
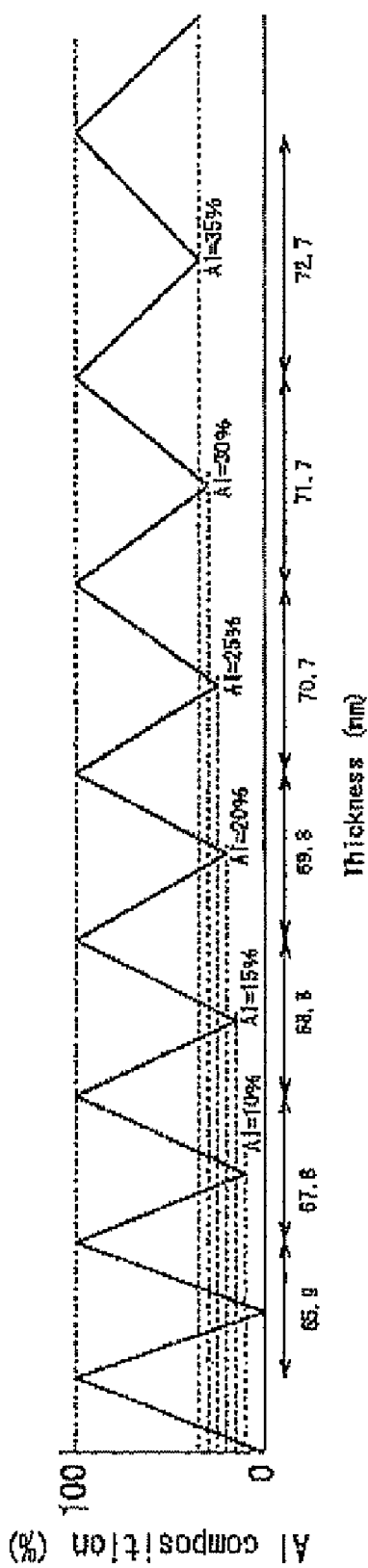
FIG. 5 is a graph illustrating one example of a pattern of the Al composition in a light dispersing multilayered film made of an $Al_xGa_{(1-x)}As$ material according to Comparative Example 2.

A light dispersing multilayered film was grown on the substrate similar to Example 1 by using the MOCVD method such that the light dispersing multilayered film was made of a $Al_xGa_{(1-x)}As$ material (0≦x≦1), and, as illustrated in FIG. 5, the Al composition in the $Al_xGa_{(1-x)}As$ material was designed such that the lower Al composition was formed by 0%×1, 10%×1, 15%×1, 20%×1, 25%×1, 30%×1, 35×1 cycles, and the thicknesses of the respective sets of cycle were set at 65.9 nm, 67.8 nm, 68.8 nm, 69.8 nm, 70.7 nm, 71.7 nm, 72.7 nm so as to reflect the wavelength of 870 nm of the substrate excited light. Then, the PL measurement was made on this light dispersing multilayered film. Note that, since the cycle of the lower Al composition 0% to the higher Al composition 100% (32.9 nm) on the left end and the cycle of the higher Al composition 100% to the lower Al composition 35% (36.4 nm) on the right end do not have the confining effect, these cycles are not included in the number of pairs.

Comparative Example 3

Figure 6:
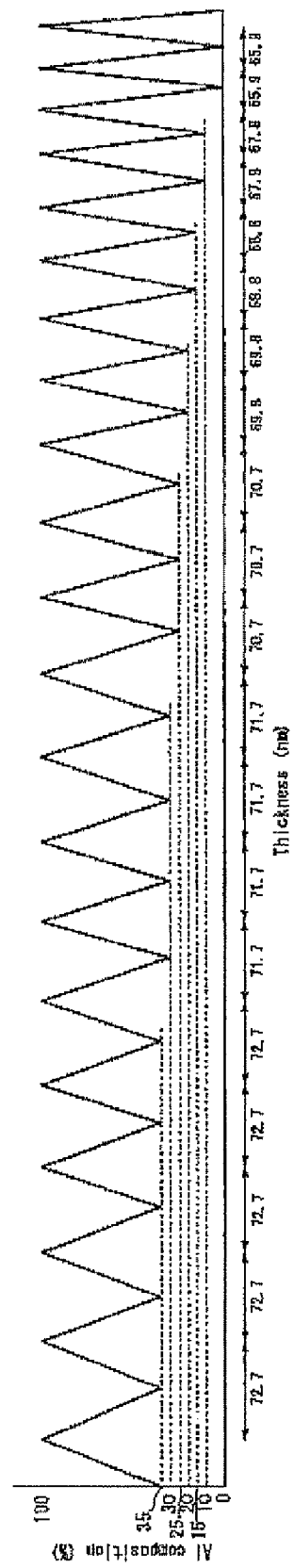
FIG. 6 is a graph illustrating one example of a pattern of the Al composition in a light dispersing multilayered film made of an $Al_xGa_{(1-x)}As$ material according to Comparative Example 3.

A light dispersing multilayered film was grown on the substrate similar to Example 1 by using the MOCVD method such that the light dispersing multilayered film was made of a $Al_xGa_{(1-x)}As$ material (0≦x≦1), and, as illustrated in FIG. 6, the Al composition in the $Al_xGa_{(1-x)}As$ material was designed such that the lower Al composition was formed by 35%×5, 30%×4, 25%×3, 20%×2, 15%×2, 10%×2, 0%×2 cycles, and the thicknesses of the respective sets of cycles were set at 72.7 nm, 71.7 nm, 70.7 nm, 69.8 nm, 68.8 nm, 67.8 nm, 65.9 nm so as to reflect the wavelength of 870 nm of the substrate excited light. Then, the PL measurement was made on this light dispersing multilayered film. Note that, since the cycle of the lower Al composition 35% to the higher Al composition 100% (36.4 nm) on the left end and the cycle of the higher Al composition 100% to the lower Al composition 0% (32.9 nm) on the right end do not have the confining effect, these cycles are not included in the number of pairs.

Comparative Example 4

Figure 7:
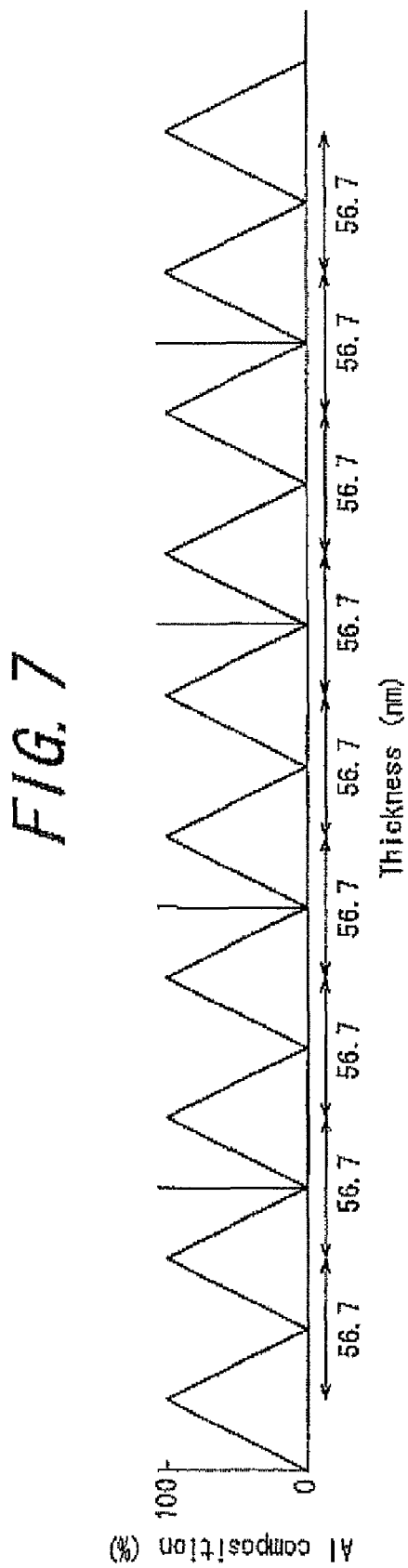
FIG. 7 is a graph illustrating one example of a pattern of the Al composition in a light dispersing multilayered film made of an $Al_xGa_{(1-x)}As$ material according to Comparative Example 4.
Figure 10:
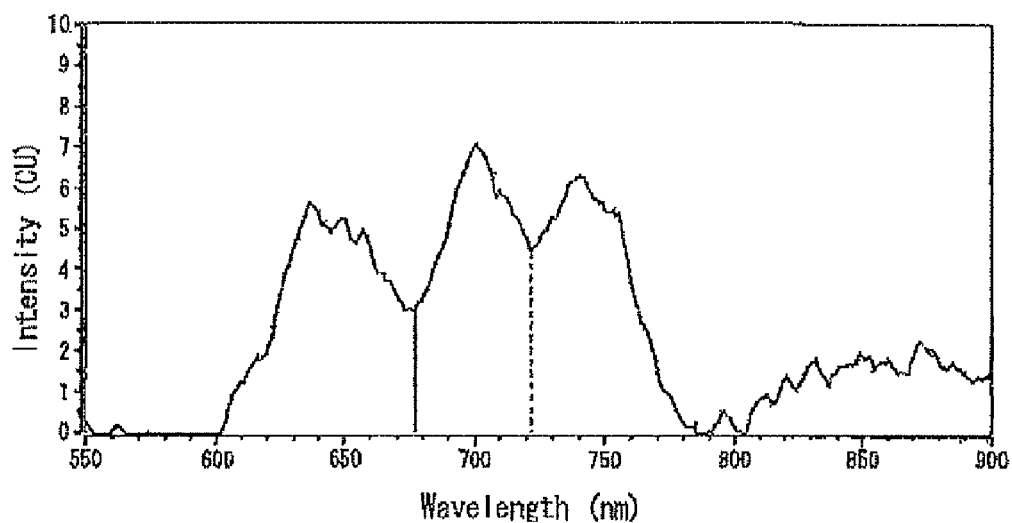
FIG. 10 is a graph illustrating results of PL spectrum measurement according to Example 1.
Figure 11:
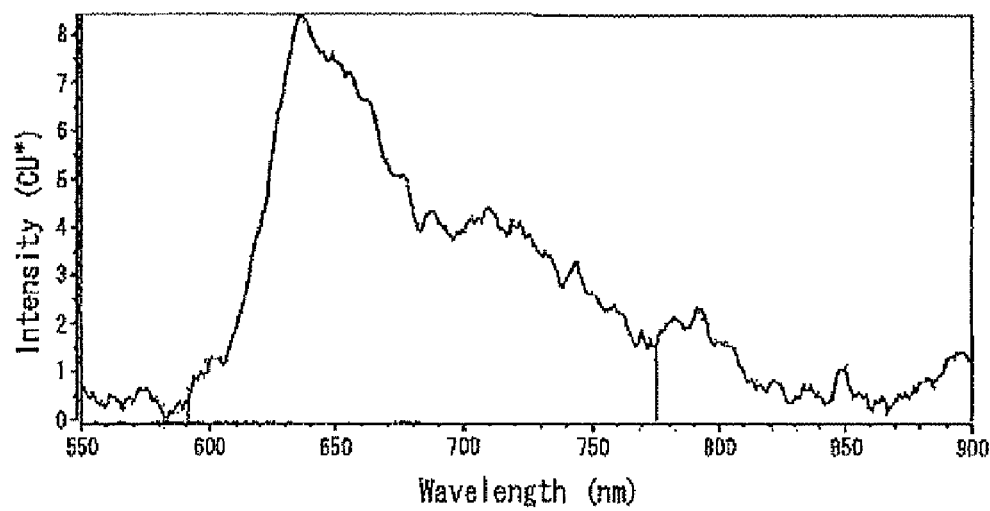
FIG. 11 is a graph illustrating results of PL spectrum measurement according to Example 2.
Figure 12:
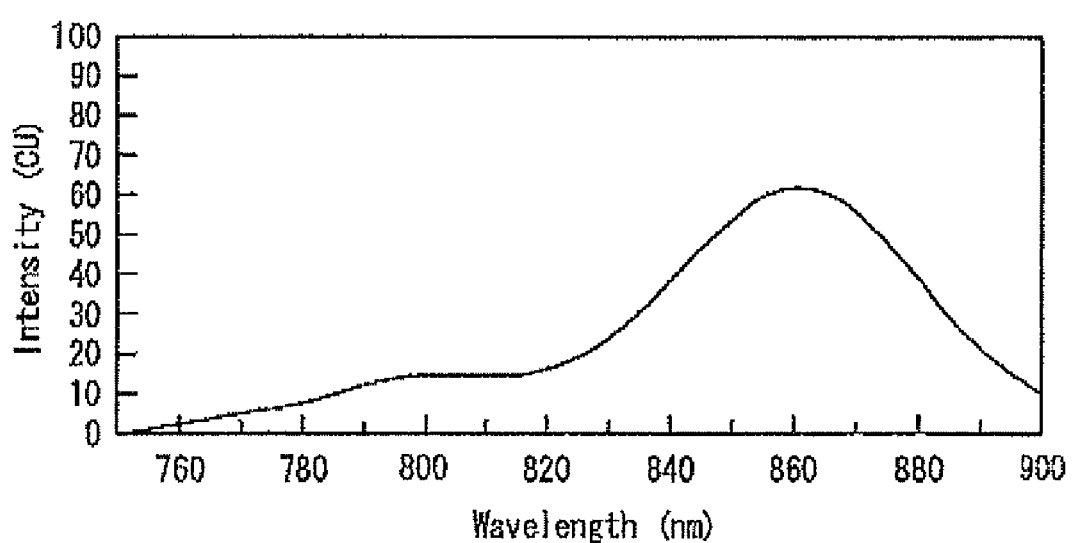
FIG. 12 is a graph illustrating results of PL spectrum measurement according to Comparative Example 1.
Figure 13:
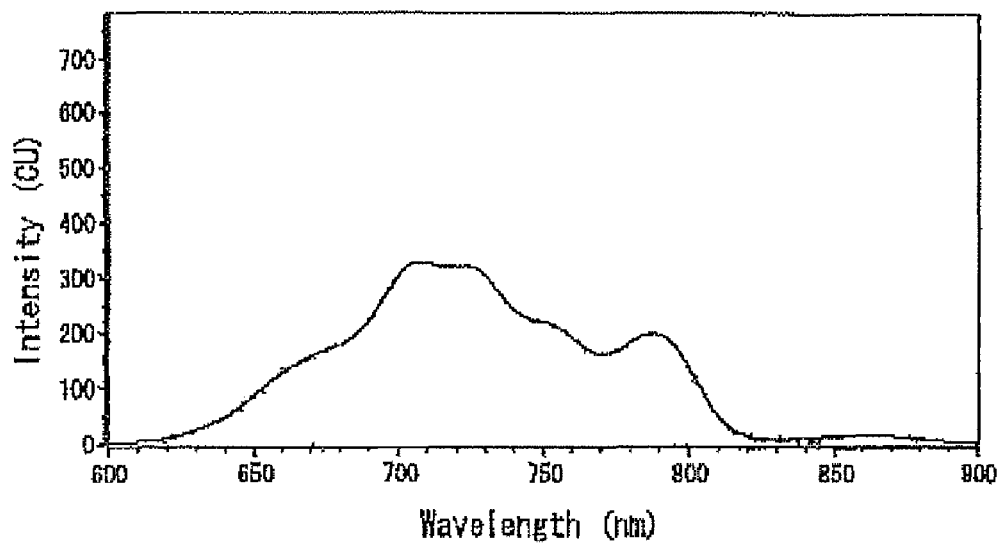
FIG. 13 is a graph illustrating results of PL spectrum measurement according to Comparative Example 2.
Figure 14:
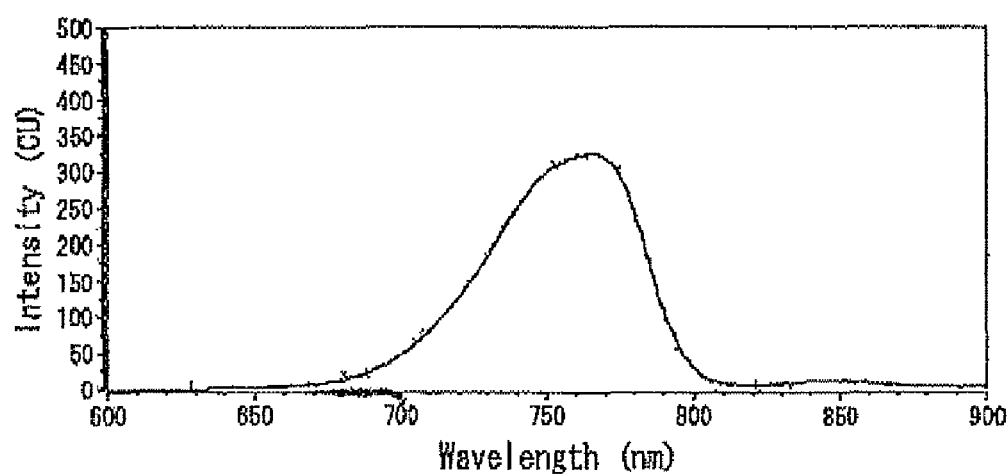
FIG. 14 is a graph illustrating results of PL spectrum measurement according to Comparative Example 3; and, FIG. 15 is a graph illustrating results of PL spectrum measurement according to Comparative Example 4.
Figure 15:
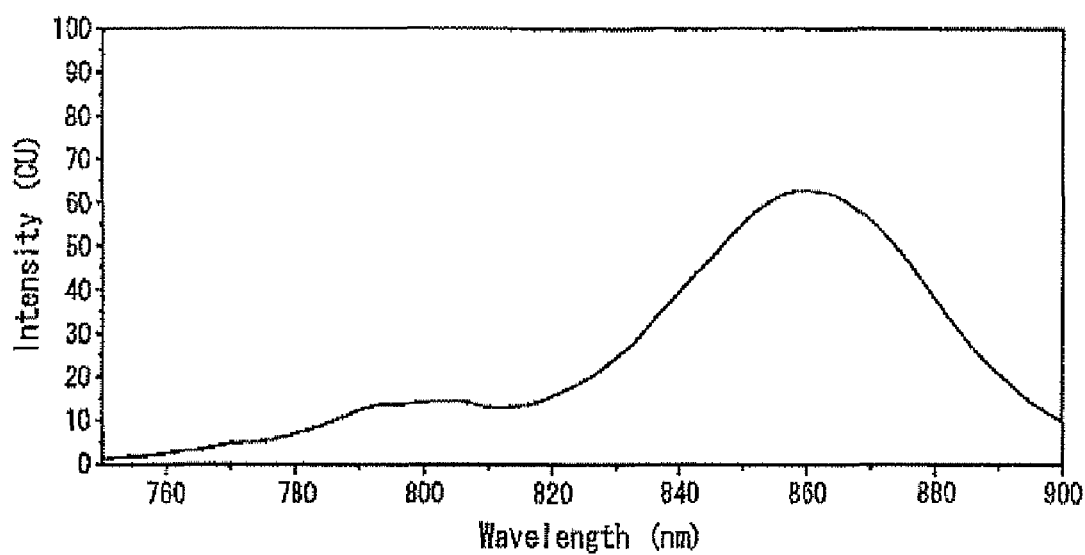

A light dispersing multilayered film was grown on the substrate similar to Example 1 by using the MOCVD such that the light dispersing multilayered film was made of a $Al_xGa_{(1-x)}As$ material (0≦x≦1), and as illustrated in FIG. 7, the Al composition in the $Al_xGa_{(1-x)}As$ material was designed such that neither the higher Al composition and the lower Al composition changed. Then, the PL measurement was made on this light dispersing multilayered film.

Evaluation 1

The emission spectrum was measured on the light-emitting elements of Examples 1 and 2, and Comparative Example 1 described above. This measurement was performed by using a spectrum analyzer (MCPD-3000 made by Otsuka Electronics).

FIGS. 8 and 9 illustrate graphs of measurement results of Example 1 and Comparative Example 1, and Example 2 and Comparative Example 1, respectively. In the drawings, the horizontal axis represents a wavelength (nm), and the vertical axis represents an intensity of light (arbitrary unit) on the assumption that a peak value of emitted light is 1. Further, FIGS. 8B and 9B are graphs in which a wavelength range of 650-1000 nm in FIGS. 8A and 9A is enlarged, and whose vertical axes are graduated logarithmically.

Table 1 shows a total output using an integrating sphere: $P_o$ (mW), a forward voltage: $V_f(V)$, a center wavelength of the primary light with the emission spectrum measurement: $\lambda_p$(nm), and a ratio of intensity of the secondary light to the primary light ((peak intensity of secondary light)/(peak intensity of primary light)): IR (%) of Examples 1 and 2, and Comparative Example 1. Table 1 shows values obtained by mounting an LED chip on a TO-18, applying a direct electric current of 20 mA for $P_o$ and $V_f$, and, applying a direct electric current of 5 mA for $\lambda_p$ and IR. Measurement was performed by using a spectrum analyzer (MCPD-3000 made by Otsuka Electronics).

TABLE 1

|  | $P_o$ (mW) | $V_f$(V) | $\lambda_p$ (nm) | IR (%) |
|---|---|---|---|---|
| Example 1 | 1.67 | 2.06 | 641 | 0.04 |
| Example 2 | 1.67 | 1.99 | 642 | 0.05 |
| Comparative Example 1 | 1.57 | 2.05 | 640 | 0.19 |

From results shown in FIGS. 8 and 9, and Table 1, it can be understood that, in Examples 1 and 2, a peak height is lower and extends broadly, and the secondary light can be effectively dispersed, while a peak exists in the vicinity of the wavelength of 850 nm in Comparative Example 1. Further, the ratio of the intensity of the secondary light in Examples 1 and 2 is extremely lower as compared with that in Comparative Example 1.

Evaluation 2

A PL spectrum measurement (PLM-100 made by Phillips) was made on samples in which only the light dispersing multilayered films of Examples 1 and 2, and Comparative Examples 1-4 described above were grown. A D-YAG (second harmonic of YAG: Double YAG) laser (wavelength of 532 nm) was employed for a light source, and the laser was entered perpendicularly to the respective samples.

FIGS. 10 through 15 illustrate graphs of measurement results of Examples 1-2, and Comparative Examples 1 through 4 described above, respectively. In the drawings, the horizontal axis represents a wavelength (nm), and the vertical axis represents an intensity. From these results, it can be understood that the intensities of the PL spectrum of Examples 1 and 2 are 10 times or more smaller than those of Comparative Examples 1-4, and the peak wavelength of the emitted light can be dispersed into plural pieces. Therefore, from these results, it can be easily expected that it is impossible for the light-emitting elements employing the light dispersing multilayered film of Comparative Examples 2-4 to sufficiently suppress and disperse the secondary light.

INDUSTRIALLY APPLICABILITY

The light-emitting element according to the present invention is provided with the light dispersing multilayered film disposed between the substrate and the reflective film and having two or more types of the light dispersing layers. With this light dispersing multilayered film, the secondary light excited by the primary light passing through the reflective film is multiply dispersed into plural wavelengths and is discharged, whereby the excitement of the substrate by the primary light can be suppressed and the noises with respect to the signal light and can be reduced.

EXPLANATION OF REFERENCE NUMERALS

1 Light-emitting element
2 Substrate
3 Light-emitting layer
4 Reflective film
5 Light dispersing multilayered film
6 Clad layer
7 Clad layer

The invention claimed is:

1. A light-emitting element comprising a substrate; a light-emitting layer disposed above the substrate and emitting a primary light; and, a reflective film disposed between the substrate and the light-emitting layer and formed by at least one layer that reflects the primary light, wherein
   the light-emitting element further comprises a light dispersing multilayered film disposed between the substrate and the reflective film and formed by two or more types of light dispersing layers, and
   the light dispersing multilayered film multiple-disperses a secondary light into plural wavelengths and discharges the secondary light, which is excited by the primary light passing through the reflective film.

2. The light-emitting element according to claim 1, wherein
   the light dispersing multilayered film is made of an $Al_xGa_{(1-x)}As$ material ($0 \leq x \leq 1$),
   an Al composition (x) in the $Al_xGa_{(1-x)}As$ material is made continuously changed between a lower Al composition and a higher Al composition in a thickness direction of the light dispersing multilayered film from the substrate side toward the reflective film side, while the change is being made plural times, and
   the Al composition (x) of at least one of the lower Al composition and the higher Al composition to be changed and a thickness of each of the light dispersing layers are changed in a stepwise manner.

3. The light-emitting element according to claim 2, wherein
   a difference of the Al composition (x) between the lower Al composition and the higher Al composition is sequentially decreased for every plural cycles from the substrate side toward the reflective film side, and
   the thickness of each of the light dispersing layers is sequentially increased for every plural cycles from the substrate side toward the reflective film side.

4. The light-emitting element according to claim 1, wherein
   the light dispersing multilayered film reflects a substrate excited light excited by the primary light passing through the light dispersing multilayered film and reaching the substrate.

5. The light-emitting element according to claim 1, wherein
   the thickness of the light dispersing multilayered film is 500-1500 nm.

6. The light-emitting element according to claim 2, wherein the light dispersing multilayered film reflects a substrate excited light excited by the primary light passing through the light dispersing multilayered film and reaching the substrate.

7. The light-emitting element according to claim 3, wherein the light dispersing multilayered film reflects a substrate excited light excited by the primary light passing through the light dispersing multilayered film and reaching the substrate.

8. The light-emitting element according to claim 2, wherein the thickness of the light dispersing multilayered film is 500-1500 nm.

9. The light-emitting element according to claim 3, wherein the thickness of the light dispersing multilayered film is 500-1500 nm.

10. The light-emitting element according to claim 4, wherein the thickness of the light dispersing multilayered film is 500-1500 nm.

11. The light-emitting element according to claim 6, wherein the thickness of the light dispersing multilayered film is 500-1500 nm.

12. The light-emitting element according to claim 7, wherein the thickness of the light dispersing multilayered film is 500-1500 nm.

13. The light-emitting element according to claim 1, wherein each of the two or more types of the light dispersing layer excites light of a different wavelength.

\* \* \* \* \*